United States Patent [19]

Suzuki et al.

[11] 4,231,108
[45] Oct. 28, 1980

[54] SEMICONDUCTOR INTEGRATED CIRCUIT DEVICE

[75] Inventors: Masao Suzuki, Kodaira; Toshio Hayashi, Tokorozawa; Kuniyasu Kawarada, Musashino; Kazuhiro Toyoda, Yokohama; Chikai Ono, Kawasaki, all of Japan

[73] Assignees: Nippon Telegraph and Telephone Public Corporation; Fujitsu Limited, both of Tokyo, Japan

[21] Appl. No.: 48,256

[22] Filed: Jun. 13, 1979

[30] Foreign Application Priority Data

Jun. 14, 1978 [JP] Japan ................................. 53-71666

[51] Int. Cl.$^3$ ............................................. G11C 11/40
[52] U.S. Cl. ..................................... 365/174; 365/189; 365/226; 307/238
[58] Field of Search ............... 365/103, 104, 174, 189, 365/226, 210; 307/238

[56] References Cited

U.S. PATENT DOCUMENTS 3,959,781   5/1976   Metha et al. ...................... 365/210

Primary Examiner—Terrell W. Fears
Attorney, Agent, or Firm—Staas & Halsey

[57] ABSTRACT

An improved semiconductor integrated circuit device having a memory cell array formed of integrated injection logic memory cells. The semiconductor integrated circuit according to the present invention includes integration injection logic memory cells which are arranged in matrix form, word lines and bit lines which are connected to the memory cells arranged in the row or column directions, one of the word lines being formed by a semiconductor bulk, current sources provided at least at both ends of the word lines or the bit lines.

9 Claims, 17 Drawing Figures

SEMICONDUCTOR INTEGRATED CIRCUIT DEVICE

FIELD OF THE INVENTION

The present invention relates to an improvement of a semiconductor integrated circuit memory device in which memory cells formed by integrated injection logic are arranged as a memory array.

BACKGROUND OF THE INVENTION

Recently, a low power semiconductor memory or a high capacity semiconductor memory has been used. In conventional memory cells used in a semiconductor memory, resistors are used as load impedances of flip-flop transistors which are used in the memory cells, and also, an insulation between transistors is required, so that the conventional memory cells are large in size. Therefore, a memory chip is also large in size and the density of the memory chips which are included in one wafer can not be increased, so that the cost of a semiconductor memory is expensive.

For the purpose of obtaining memory cells having small dimensions, memory cells using integrated injection logic are used.

At present, memory cells which are constituted by integrated injection logic are important, because such memory cells can be formed with high integration density. Such memory cells are disclosed, for example, in the articles "Write Current Control and Self Powering in a Low Power Memory Cell", IEEE, SSC, Jun., 1973, and "Superintegrated Memory Shares Functions on Diffused Islands", Electronics, Feb. 14, 1972, p83-p86. The former discloses a method of controlling a write current to the integrated injection logic memory cell and the latter discloses a basic idea with respect to the integrated injection logic memory cell.

As disclosed in the above mentioned articles, the integrated injection logic memory cell comprises a pair of first and second transistors which have emitters comprising an injector which are commonly connected to a word line W+, said first and second transistors having a first polarity, a pair of third and fourth transistors which have their collectors connected to collectors of the first and second transistors, respectively the base of the third transistor being connected to the collector of said fourth transistor and the base of the fourth transistor being connected to the collector of said third transistor, both the third and fourth transistors having a second polarity, and a bulk that is a word line W− which is connected to the bases of the first and second transistors and to the emitters of the third and fourth transistors.

The integrated injection logic memory cells are arranged as the memory array. In these integrated injection logic memory cells, the word line W− is formed as the bulk, and the bulk usually consists of two n type layers, an epitaxial layer and a buried layer. The epitaxial layer is formed on the buried layer which has higher conductivity than the epitaxial layer. Therefore, the bulk, that is, the word line W− has a larger resistance than a metallic wire, and this resistance exists between each cell.

When the bulk is used as the word line W− which supplies the hold current, the characteristics of the cells are different in accordance with the positions of the cells in the line of the array. In other words, in the conventional integrated injection logic memory, the hold current source is provided at only one end of the word line W−. Therefore, injection currents which are supplied to the cells near the end of the word line vary according to the bulk resistance, so that uniform distribution of the injection currents to the memory cells cannot be obtained. Therefore, in the memory cell arranged near the end of the word line, a write threshold current Iwth increases and, also, the width of the write pulse increases.

OBJECTS AND SUMMARY OF THE INVENTION

An object of the present invention is to equalize the characteristics of the integrated injection logic memory cells which are arranged as a memory array.

Another object of the present invention is to equalize the injection currents which are supplied to a memory cell when a memory cell array is formed by integrated injection logic memory cells, so as to dissipate no excessive electrical power and, also, so as to improve the characteristics of the memory cells.

For achieving the above-mentioned objects, the semiconductor integrated circuit according to the present invention comprises integrated injection logic memory cells which are arranged in matrix form, word lines which are connected to the memory cells arranged in the row direction and which are formed by a semiconductor bulk, and current sources which are provided at at least both ends of the word lines.

Further features and advantages of the present invention will be apparent from the ensuing description with reference to the accompanying drawings, to which, however, the scope of the invention is in no way limited.

DETAILED EXPLANATION OF THE INVENTION

Figure 1A:
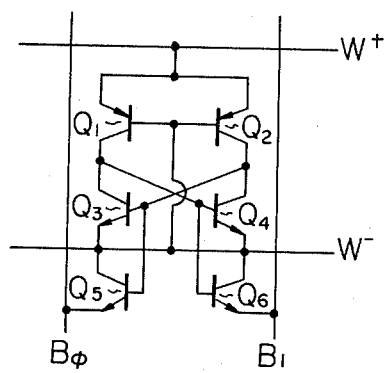
FIGS. 1A, 1B and 1C illustrate equivalent circuits of a memory cell corresponding to one bit of a memory array formed by an integrated injection logic memory cell.
Figure 1B:
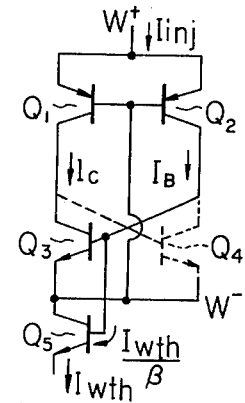
Figure 1C:
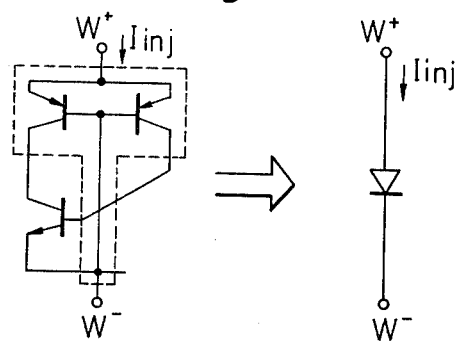
Figure 2:
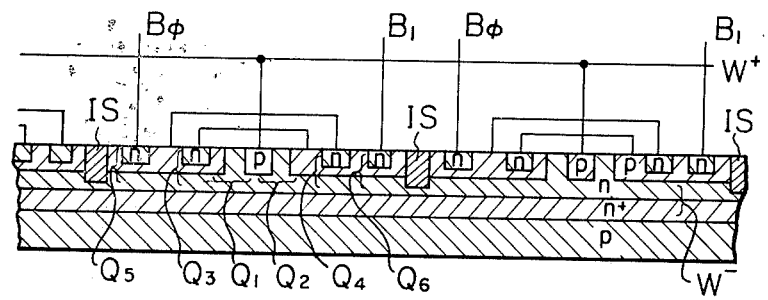
FIG. 2 illustrates a cross section of the memory array formed by the integrated injection logic memory cell.

FIG. 1A is an illustration of an equivalent circuit corresponding to one memory cell which is formed by integrated injection logic. In FIG. 1A, $Q_1$ through $Q_6$ designate transistors, W+ and W− designate word lines, and $B_1$ and $B\phi$ designate bit lines, respectively. FIG. 2 illustrates a cross sectional view of the memory array formed by the integrated memory cells illustrated in FIG. 1. In FIG. 2, symbols which are the same as in FIG. 1 designate corresponding parts of those illustrated in FIG. 1.

Referring to FIGS. 1A and 2, a p type conduction region which is connected to the word line W+ is an injector, and the p type conduction region is actuated as common emitters of lateral pnp transistors $Q_1$, $Q_2$. This will be understood when FIG. 2 is compared with FIG. 1A. As illustrated in FIGS. 1A and 2, the transistors $Q_1$ and $Q_2$ are used as loads, the usual collector regions of npn transistors $Q_3$ and $Q_4$ which are connected to a word line W− are used as emitters, and the usual emitter regions of npn transistors $Q_3$ and $Q_4$ are used as collectors. Therefore, a bulk, that is, an n type conduction region, which is commonly used as the bases of the pnp transistors $Q_1$ and $Q_2$, and as the emitters of the npn transistors $Q_3$ and $Q_4$, can be used as a buried word line W−, so that the cells can be formed in a high density.

Referring to the memory cell illustrated in FIG. 1A, transistors $Q_3$ and $Q_4$ are placed in the on and off state alternately. That is, for example, when the transistor $Q_3$ is placed in the on state, the transistor $Q_4$ is placed in the off state. FIG. 1B illustrates an equivalent circuit of FIG. 1A when the transistor $Q_3$ is placed in the on state. An injection current Iinj supplies a base current of the on state transistor $Q_3$. In order to change the cell information, the on state transistor $Q_3$ should be changed to the off state. This is done by supplying an emitter current larger than the write threshold current Iwth of the transistor $Q_5$ and by bypassing the base current of the transistor $Q_3$ to the base current of the transistor $Q_5$. As the base current of the transistor $Q_3$ depends on the injection current Iinj supplied to the injector, the write threshold current Iwth depends on the injection current Iinj. Therefore, in the conventional memory cells, the write threshold current is large in the cell where the injection current is large. FIG. 1C illustrates the fact that an equivalent circuit of a memory cell which is not selected is replaced to an equivalent diode.

Figure 3:
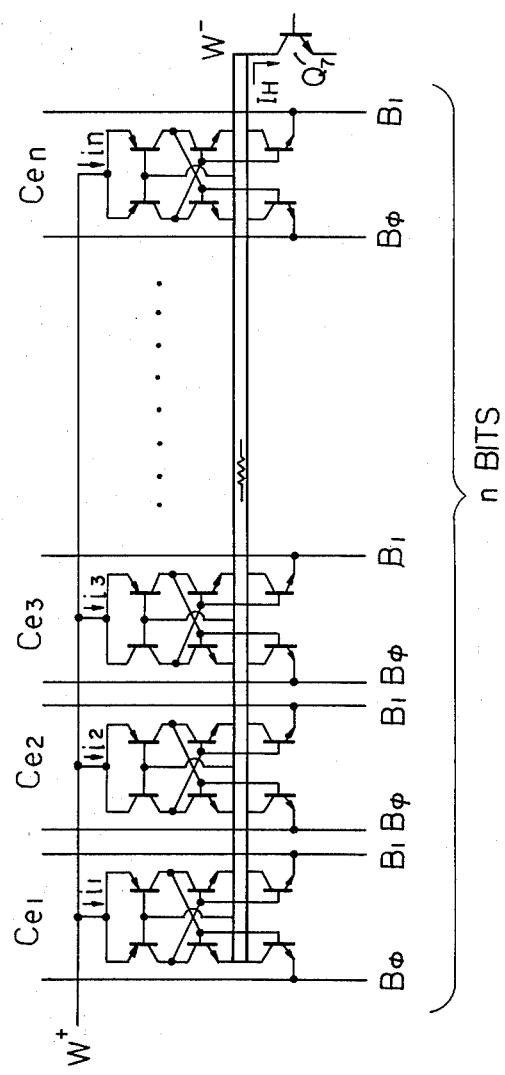
FIG. 3 illustrates an array of n bits using the integrated injection logic memory cells and showing a hold circuit to one end of the word line.

FIG. 3 illustrates an array having n bits by using the memory cells illustrated in FIGS. 1A and 2, which array provides a hold circuit. Referring to FIG. 3, $Ce_1$, $Ce_2$, ... $Ce_n$ designate a first, a second, ..., an n'th cell, respectively. A common emitter n type conduction region word line W− is used, as already mentioned, as an underpass connection. A transistor $Q_7$ is provided for supplying injection currents $i_1$, $i_2$, ... $i_n$ to the cells $Ce_1$, $Ce_2$, ..., $Ce_n$ in the array, and the transistor $Q_7$ is used as the current source for supplying the hold current $I_H$. Therefore, the following equation can be established.

$$i_1 + i_2 + \ldots + i_n = I_H$$

The common emitter n type region of the word line W− consists of two n type layers, an epitaxial layer and a buried layer. The epitaxial layer is formed on the buried layer which has higher density of the impurity than the epitaxial layer. Therefore, the word line W− has a larger resistance than a metallic layer, and this resistance is due to the bulk resistance and exists between each cell. This resistance deteriorates the characteristics of the semiconductor memory which utilizes integrated injection logic memory cells. This is due to the following reason.

Figure 4A:
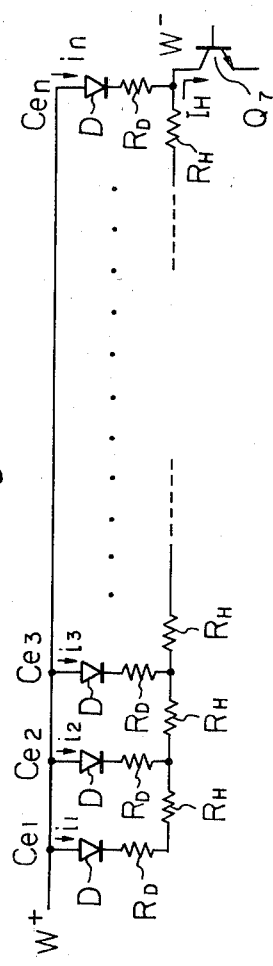
FIG. 4A illustrates an equivalent circuit of word line in FIG. 3.

As the cells $Ce_1$, $Ce_2$, ... $Ce_n$ are illustrated as equivalent diodes which are connected between the word line W+ and the word line W−, the circuit illustrated in FIG. 3 can be illustrated as the equivalent circuit in FIG. 4A. Referring to FIG. 4A "D" designates the equivalent diode, "$R_O$" designates a series resistance which is due to the afore-mentioned n type epitaxial layer, and "$R_H$" designates a resistance component between the memory cells $Ce_1$, $Ce_2$, ..., $Ce_n$.

Figure 4B:
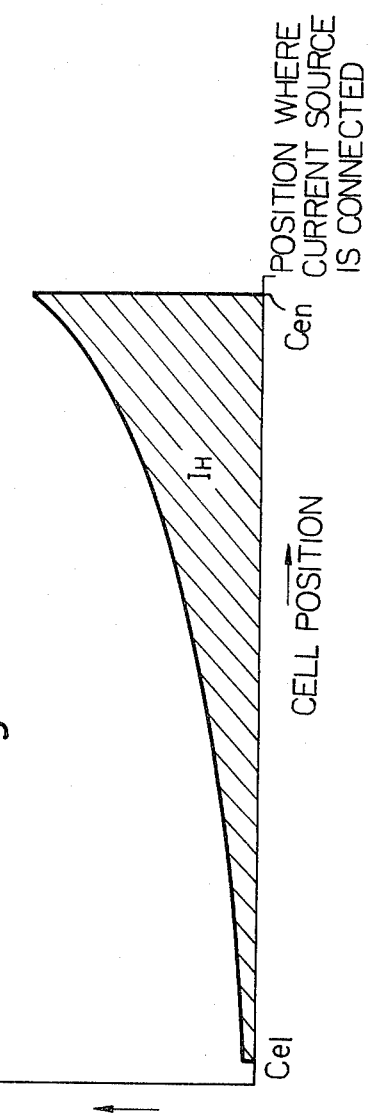
FIG. 4B is a diagram illustrating a distribution of injection currents supplied to the memory cells in the circuit illustrated in FIG. 4A.

When the hold current $I_H$ is supplied via the transistor $Q_7$ in the circuit illustrated in FIG. 4A, the injection current supplied to each memory cell exponentially decreases from the cell $Ce_n$ to the cell $Ce_1$ as shown in FIG. 4B, due to the resistance $R_H$, which exists in the word line W− between each cell. That is, the injection current which is supplied to the cell $Ce_1$), which is at an opposite end to the transistor $Q_7$ has a minimum value.

The injection current which can assure the function of the memory cells, has a lower limit which is determined by the current amplification factor $h_{FE}$ of the transistor. Further, as it is required that all memory cells in the memory array be assured of operation, the hold current $I_H$ in the memory array must be determined taking into the consideration the minimum injection current that must be supplied to the memory cell $Ce_1$. Therefore, surplus injection currents must be supplied in the cells $Ce_2$, ..., $Ce_n$, and the excessive electrical power must be dissipated in the memory array. Further, as the injection current to each cell is exponentially distributed, as shown in FIG. 4B, in accordance with the position of the cells, the read and write characteristics of the memory cells are also different in accordance with the position of the cells.

Figure 5:
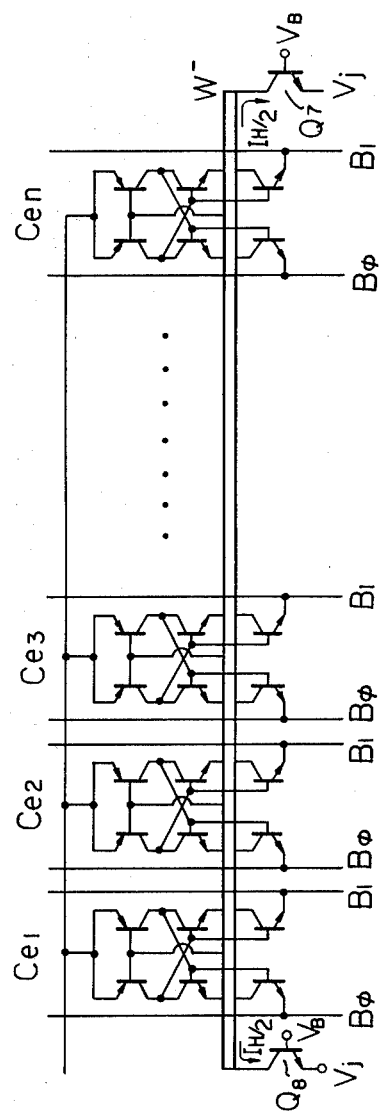
FIG. 5 illustrates a circuit of one embodiment of the present invention.

FIG. 5 illustrates a circuit of one embodiment of the present invention. The circuit illustrated in FIG. 5 is formed as an n bit array and the same symbols as used in FIG. 3 indicate the same elements as in FIG. 3.

In the circuit illustrated in FIG. 5, the transistor $Q_7$ is connected to one end of the word line W−, at a $_f$ position near the memory cell $Ce_n$, and the current H/2 is supplied to the transistor $Q_7$. A transistor $Q_8$ is connected to the other end of the word line W−, at a $_f$ position near the memory cell $Ce_1$, and the current H/2 is supplied to the transistor $Q_8$. That is, in the present invention, the transistors $Q_7$ and $Q_8$ are connected respectively to each end of the word line W− and the hold current $I_H$ is equally distributed to the transistors $Q_7$ and $Q_8$.

Figure 6:
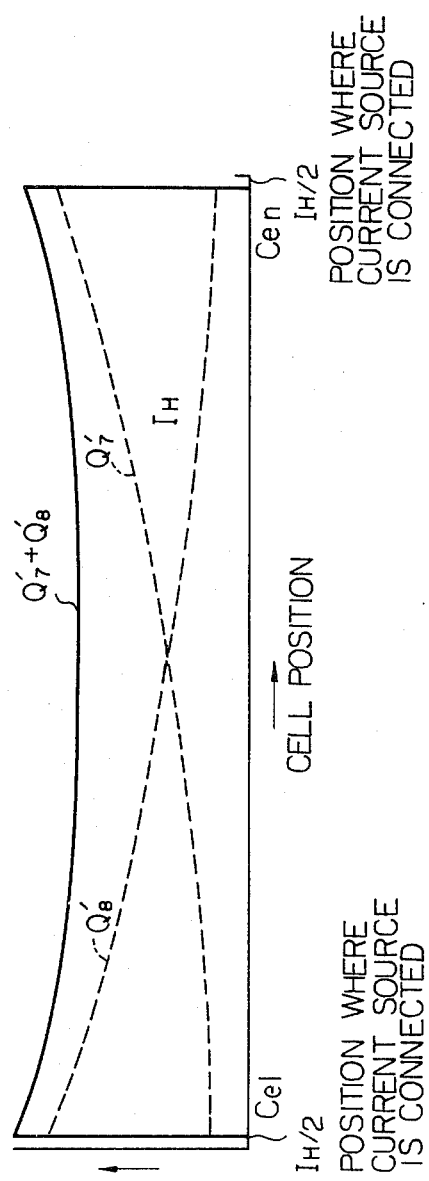
FIG. 6 is a diagram illustrating the distribution of injection currents supplied to the memory cells in the circuit illustrated in FIG. 5.

The distribution of the injection currents supplied to each cell in the circuit illustrated in FIG. 5 is shown in the diagram of FIG. 6. Referring to FIG. 6, a broken line $Q_7'$ shows the distribution of the injection currents when only the transistor $Q_7$ is provided, and the broken line $Q_8'$ shows the distribution of the injection currents when only the transistor $Q_8$ is provided. As seen from the broken lines $Q_7'$ and $Q_8'$, the value of the injection current has a maximum value at the side where the transistor is connected and the values of the injection current decrease exponentially. However, in the present invention, as the transistors $Q_7$ and $Q_8$ are respectively connected to each end of the word line W—, the distribution of the injection current which is shown by the full line $Q_7' + Q_8'$ can be obtained. That is, by the combination of the characteristics shown by the broken lines $Q_7'$ and $Q_8'$, the injection current supplied to each cell can be equalized.

Figure 7A:
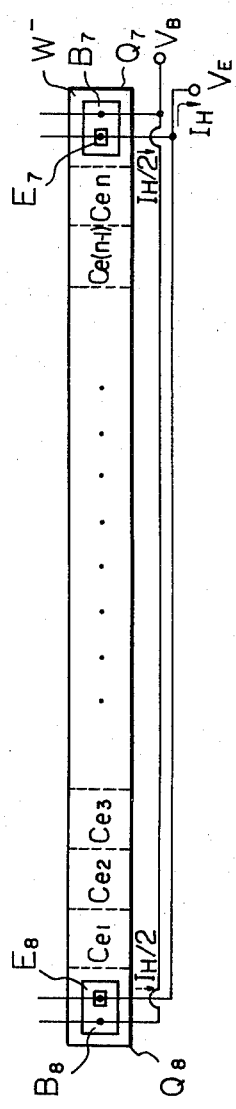
FIGS. 7A and 7B illustrate a plan view and a sectional view respectively, of the circuit illustrated in FIG. 5.
Figure 7B:
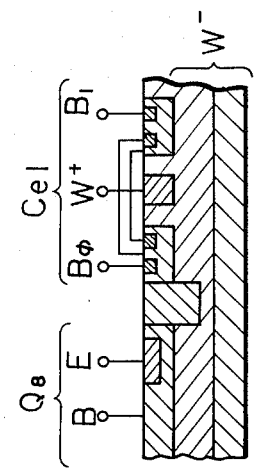

FIG. 7A is a plan view of the essential part of the circuit illustrated in FIG. 5 and FIG. 7B illustrates a cross sectional view of the circuit near the transistor $Q_8$ in FIG. 7A. In FIGS. 7A and 7B, the dimensions of the word lines W+, W—, and "n" and "p" type diffusion regions are not proportional to the actual circuit.

Referring to FIG. 7A, the word line W—, that is, the common "n" type conduction region of the bulk, is commonly used for the collectors of the transistor $Q_7$ and $Q_8$. The areas of emitters $E_7$ and $E_8$ of the transistors $Q_7$ and $Q_8$ are equal and each emitter of the transistors $Q_7$ and $Q_8$ is connected via a connection wire to a terminal $V_E$. Further, bases $B_7$ and $B_8$ of the transistors $Q_7$ and $Q_8$ are connected via a connection wire to a terminal $V_B$. When a suitable bias voltage is supplied to the terminals $V_B$ and $V_{EI}$, so as to supply the hold current $I_H$, equal currents H/2 are supplied to the transistors $Q_7$ and $Q_8$, which have an equal emitter area, so that the distribution of the injection current shown in FIG. 6 can be obtained.

The scope of the present invention is not limited to the above-mentioned embodiment, and many modifications thereof are possible. In the above-mentioned embodiment, the "npn" type integrated injection memory is used in the memory cell, however, the present invention can be used regardless of the conduction type of the memory cell when a resistance exists in the word line (for example W—). Further, in the embodiment illustrated in FIG. 5, the transistors used as the current source are provided at both ends of the word line, however, for the purpose of more uniform distribution, a current source can be provided at the middle point of the word line, as illustrated in FIG. 8.

Figure 8:
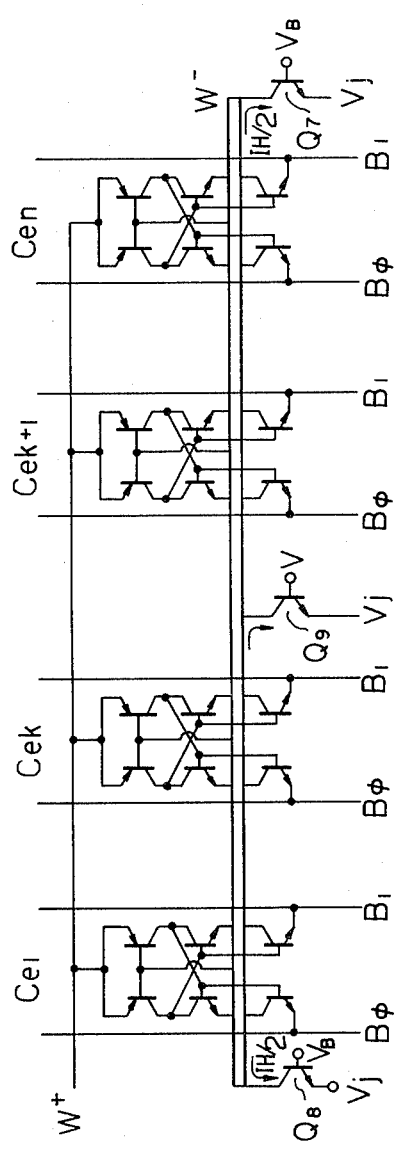
FIG. 8 is a diagram of another embodiment of the present invention.
Figure 9:
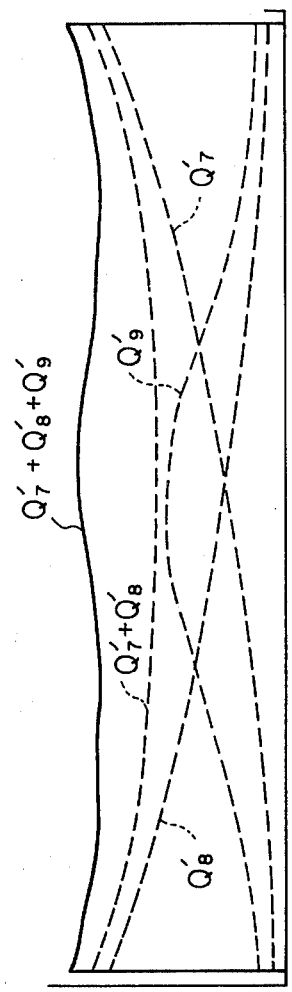
FIG. 9 is a diagram illustrating a distribution of injection currents supplied to the memory cells in the circuit illustrated in FIG. 5.

In the embodiment illustrated in FIG. 8, beside the transistors $Q_7$ and $Q_8$ of FIG. 5, the transistor $Q_9$ is further provided at the middle point of the word line as a current source. FIG. 9 shows the distribution of the injection currents supplied to each cell in the circuit illustrated in FIG. 8. Referring to FIG. 9, curves $Q_7'$, $Q_8'$, $Q_9'$ respectively show the distribution of the injection current when only the transistor $Q_7$, $Q_8$ or $Q_9$ is provided. A curve $Q_7' + Q_8'$ shows the distribution of the injection currents when the transistors $Q_7$ and $Q_8$ are connected to both ends of the word line, and this curve $Q_7' + Q_8'$ corresponds to the full line $Q_7' + Q_8'$ shown in FIG. 6. In the embodiment illustrated in FIG. 8, as the transistor $Q_9$ is further provided at the middle point of the word line, a flatter distribution curve $Q_7' + Q_8' + Q_9'$ than that of FIG. 5 can be obtained.

Figure 10A:
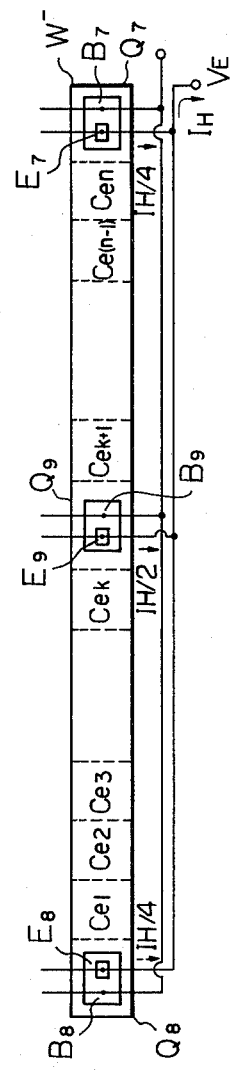
FIGS. 10A and 10B illustrate a plan view and a sectional view, respectively, of the circuit illustrated in FIG. 8.
Figure 10B:
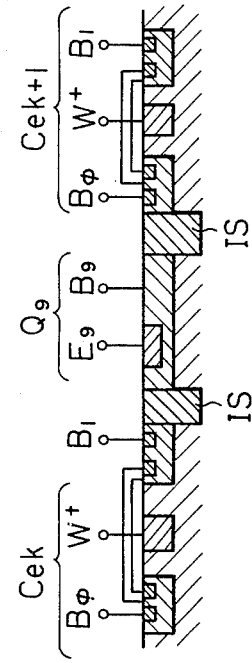

FIG. 10A is a plan view of the essential part of the circuit illustrated in FIG. 8 and in FIG. 10A, the distribution ratio of the hold currents is selected to be 1:2:1. FIG. 10B is a cross sectional view of the circuit near the transistor $Q_9$ at the middle point of the word line in FIG. 10A. In FIGS. 10A and 10B, the dimensions of the word lines W+ and W—, and the "n" and "p" type diffusion regions is not proportional to the actual circuit.

Figure 11A:
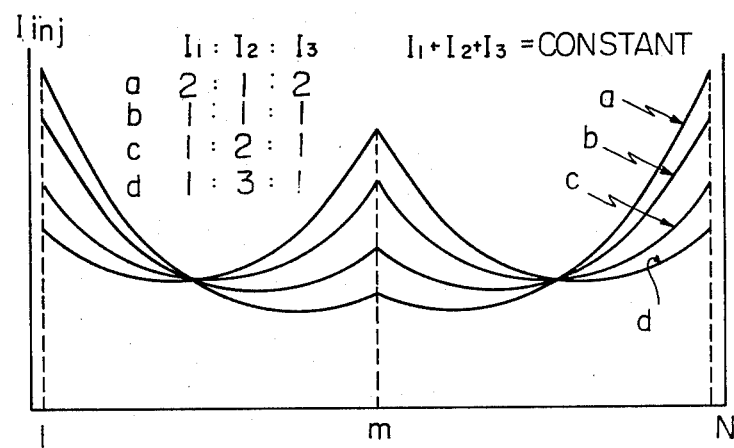
FIGS. 11A and 11B are diagrams illustrating a variation of the distribution of the injection currents supplied to memory cells when the ratio of the hold currents in the circuit illustrated in FIG. 8 is changed.
Figure 11B:
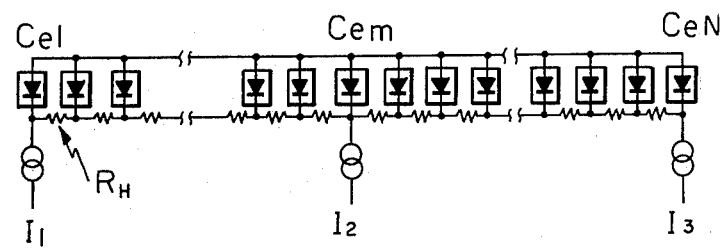

FIG. 11A shows examples of the result of the simulation of the injection current to each cell $Ce_1$, $Ce_2$, . . . , $Ce_n$ in the circuit illustrated in FIG. 8. FIG. 11A shows the variation of the distribution of the injection currents when the ratio of the hold current $I_1$, $I_2$ and $I_3$ in the equivalent circuit of FIG. 11B is changed. In FIG. 11A, the value of the vertical axis is magnified in order to distinguish the differences between the cases. In FIG. 11A, "a" designates a curve obtained when the ratio of the hold currents is selected to be 2:1:2, "b" designates a curve obtained when the ratio of the hold currents is selected to be 1:1:1, "c" designates a curve obtained when the ratio of the hold currents is selected to be 1:2:1, and "d" designates a curve when the ratio of the hold currents is selected to be 1:3:1. In FIGS. 11A and 11B, it is assumed that the sum of the hold currents $I_1$, $I_2$ and $I_3$ is constant and that the value of the resistance $R_H$ is in the range of from 20 to 100Ω. As illustrated in FIG. 11A, the flattest distribution curve of the injection currents of the cells can be obtained when the dividing ratio of the hold current $I_H$ is selected to be 1:2:1. The embodiment illustrated in FIG. 10A is based on this flattest distribution curve. Further, a flatter distribution curve can be obtained by providing further current sources and by selecting a suitable ratio of the hold currents. In addition, in the above-mentioned embodiment, the semiconductor bulk is used as the word line, however, it should be understood that the the semiconductor bulk can be used as the bit line.

As mentioned above, according to the present invention, even if a semiconductor bulk having a larger resistance than a metallic wire is used as the word line or bit line, the distribution of the injection currents to each cell can be equalized by providing current sources at both ends of the memory cell array or by further providing a current source at a middle portion of the memory cell array. Therefore, the surplus current which flows in each memory cell can be removed so that no excessive power of the memory cell array is dissipated. Further, the value of a minimum injection current to each cell can be increased as compared with the conventional memory cell array, so that the design margin of the action of the memory cell array can be increased. In addition, as the injection current to each cell is not influenced by the position of the cell, the write and read characteristics of the memory cells can be equalized.

What is claimed is:

1. A semiconductor integrated circuit device having an array of integrated injection logic memory cells, each said integrated injection logic memory cell comprising a pair of first and second transistors of first conduction type with common emitters forming an injector connected to a first word line, a pair of third and fourth transistors of second conduction type having their collectors connected to the collectors of said first and second transistors, respectively, the base of said third transistor being connected to said collector of said fourth transistor and the base of said fourth transistor being connected to said collector of said third transistor, said first and second transistors having bases connected in common to emitters of said third and fourth transistors and to a second word line, said second word line thusly connecting to each said memory cell of said at least one array, said semiconductor integrated circuit device comprising a bulk of said semiconductor device forming said second word line,
at least two current sources connected in a distributed fashion to said second word line of said memory cell array.

2. A semiconductor integrated circuit device according to claim 1 and further having first and second bit lines, each said integrated injection logic memory cell further comprising a pair of fifth and sixth transistors of second conduction type having bases respectively connected to said bases of said third and fourth transistors and collectors connected to said second word line, and said fifth and sixth transistors having emitters respectively connected to said first and second bit lines.

3. A semiconductor integrated circuit device according to claim 1, said at least one memory array further comprising at least one current source connected at a middle portion of said second word line of said memory cell array.

4. A semiconductor integrated circuit device according to claim 1, wherein at least one of said current sources comprises a transistor with its collector connected to said second word line, its emitter connected to a potential source, and its base connected to a bias voltage source.

5. A semiconductor circuit device according to claim 4, wherein each has the same area.

6. A semiconductor integrated circuit device according to claim 3, each said current source comprising a transistor with its collector connected to said memory array, its emitter connected to a potential source, and its base connected to a bias voltage source, wherein the distribution of the injection current of said injector of each said memory cell is adjusted by changing the ratio of emitter areas of said transistors of said current sources.

7. A semiconductor integrated circuit device according to claim 6, wherein the emitter area of the transistor of the current source at the middle portion of said memory array is twice that of the transistors of said current sources at each end of said memory array.

8. The device of claim 1 comprising at least one of said current sources at each of said second word line.

9. The device of claim 1, 3, 5, 7 or 8, each said memory cell of said at least one array having a corresponding write threshold current and write pulse width, and said current sources of said array comprising means for equalizing said write threshold current and write pulse widths of the cells of said at least one array.

* * * * *

UNITED STATES PATENT AND TRADEMARK OFFICE
CERTIFICATE OF CORRECTION

PATENT NO. : 4,231,108
DATED : October 28, 1980
INVENTOR(S) : Suzuki et al.

It is certified that error appears in the above—identified patent and that said Letters Patent is hereby corrected as shown below:

[57] Abstract: line 10, after "bulk," insert --and--.
Column 1, line 45, after "respectively" insert --,--.
*Column 2, line 57, after "view" insert --,--.
Column 3, line 14, "of" should be --to--;
　　　　　*line 50, "to" should be --with--.
*Column 4, line 14, "afore-mentioned" should be
　　　　　　　--aforementioned--;
　　　　　*line 24, "Ce$_1$)" should be --Ce$_1$--;
　　　　　*line 25, after "Q$_7$" insert --,--;
　　　　　*line 32, after "into" delete --the--;
　　　　　*line 45, "FIG. 3" [second occurrence] should be
　　　　　　　--FIG. 5--.
*Column 6, line 63, after "line," insert --and--.
Column 7, line 9, "1" should be --8--;
　　　　　*line 20, after "each" insert --said emitter--.

Signed and Sealed this

Fourteenth Day of April 1981

[SEAL]

Attest:

RENE D. TEGTMEYER

Attesting Officer　　Acting Commissioner of Patents and Trademarks

UNITED STATES PATENT AND TRADEMARK OFFICE
CERTIFICATE OF CORRECTION

PATENT NO. : 4,231,108
DATED : October 28, 1980
INVENTOR(S) : Masao Suzuki et al.

It is certified that error appears in the above—identified patent and that said Letters Patent is hereby corrected as shown below:

Cover sheet, item [73], "Nippon Telegraph and Telephone Public Corporation; Fujitsu Limited, both of Tokyo, Japan" should be --Nippon Telegraph and Telephone Public Corporation, Tokyo, Japan and Fujitsu Limited, Kanagawa, Japan. --.

Signed and Sealed this

Fifteenth Day of December 1981

|SEAL|

Attest:

GERALD J. MOSSINGHOFF

Attesting Officer     Commissioner of Patents and Trademarks